US006385321B1

(12) United States Patent
Krueger et al.

(10) Patent No.: US 6,385,321 B1
(45) Date of Patent: May 7, 2002

(54) REACTIVE SOUND ABSORBER

(75) Inventors: Jan Krueger, Stuttgart; Philip Leistner, Renningen; Helmut Fuchs, Weil; Roland Lippold, Dresden, all of (DE)

(73) Assignee: Fraunhofer-Gesellschaft, Munich (DE)

( * ) Notice: Subject to any disclaimer, the term of this patent is extended or adjusted under 35 U.S.C. 154(b) by 0 days.

(21) Appl. No.: 09/180,899

(22) PCT Filed: May 14, 1997

(86) PCT No.: PCT/EP97/02471

§ 371 Date: Sep. 2, 1999

§ 102(e) Date: Sep. 2, 1999

(87) PCT Pub. No.: WO97/43754

PCT Pub. Date: Nov. 20, 1997

(30) Foreign Application Priority Data

May 14, 1996 (DE) ........................................ 196 19 466

(51) Int. Cl.[7] ........................ A06F 11/06; G10K 11/16; H03B 29/00

(52) U.S. Cl. ...................... 381/71.7; 381/71.5; 181/224

(58) Field of Search .............................. 381/71.1, 71.2, 381/71.5, 71.7, 71.9, 71.13, 73.1, 93, 94.1, 94.9, FOR 123, FOR 124, 152; 181/206, 207, 210, 224

(56) References Cited

U.S. PATENT DOCUMENTS

| | | | | |
|---|---|---|---|---|
| 5,233,137 A | | 8/1993 | Geddes | 381/71.5 |
| 6,078,671 A | * | 6/2000 | Kawanishi et al. | 381/71.5 |
| 6,160,892 A | * | 12/2000 | Ver | 381/71.5 |

FOREIGN PATENT DOCUMENTS

| | | |
|---|---|---|
| DE | 40 27 511 | 10/1991 |
| DE | 44 19 933 | 12/1995 |
| FR | 2 632 474 | 12/1989 |

* cited by examiner

*Primary Examiner*—Xu Mei
(74) *Attorney, Agent, or Firm*—Crowell & Moring LLP

(57) ABSTRACT

A reactive sound attenuator which includes a sensor for detecting a sound parameter in a space, e.g. a duct, consists of a signal amplifier that is used to amplify a detected signal, an electroacoustic transducer and a cavity with at least one membrane. The membrane, which is capable of moving in a vibratory manner, is part of a wall of a space, e.g. a duct wall. A sensor, which is disposed in the immediate vicinity of, in or on the membrane, detects the vibrations of the membrane. The sensor's signal, which is amplified and inverted by the amplifier, controls the membrane vibration via the electroacoustic transducer.

11 Claims, 3 Drawing Sheets

REACTIVE SOUND ABSORBER

BACKGROUND AND SUMMARY OF THE INVENTION

The invention relates to a reactive sound attenuator consisting of a cavity with sound-proof limits and including at least one membrane, an acoustic sensor in the immediate vicinity in or on said membrane, as well as an electroacoustic transducer and an inverting signal amplifier.

With reference to FIG. 5, so-called anti-noise systems shown therein are based on a simple concept. (Nelson, P. A., Elliott, S. J.: Active Control of Sound and Vibration. Academic Press Limited, London: 1992). These systems are most frequently aimed at and refined in active noise control in order to attenuate noise in ducts and passages. Here, an incident primary sound wave is detected by a microphone which is located in a duct and distinctly offset in front of the remaining components in a direction that is toward the noise source. The detected microphone signal is arithmetically rotated through 180° as precisely as possible by means of a signal processor 11. This rotated signal serves to control a loudspeaker 9 which subsequently emits a secondary sound wave.

In an ideal case, both waves are superimposed on one another along the direction of the sound wave's propagation until the wave is cancelled. This cancellation can be monitored by means of a second microphone 10 in the direction of the sound wave's propagation. This second microphone 10 outputs a signal which, at the same time, may be used to adapt the signal processor to possible variations of sound propagation in the respective duct.

This procedure can be successfully performed very precisely by means of advanced signal processors at least under laboratory conditions. However, their practical application is characterised by a high responsiveness and sensitivity to superimposed air flows or temperature variations, as well as by a high cost for electronic elements and signal processing means.

German patent document DE 40 27 511 discloses a hybrid sound attenuator as shown in FIG. 6. This system is used to realize an optimum acoustic impedance of a duct wall 1 located on the front side of a known passive sub-system 12 via a supplementing active sub-system on the rear side. The acoustic characteristics of the passive sub-system form the starting point, e.g., a layer of porous absorber material. Further elements of this hybrid sound attenuator serve to generate a rear-side terminating impedance of the passive sub-system. The acoustic pressure behind the passive sub-system must be measured with a microphone 13 to enforce this terminating impedance. The microphone voltage is then fed back to a loudspeaker 14 via signal-shaping transducer 15. Here, the calculated impedance is expected to occur on the membrane surface of the loudspeaker.

This method requires that the signal-shaping transducer proposed in German patent document DE 40 27 511 must first compensate the intrinsic characteristics of all the electromechanical components (i.e., microphone, loudspeaker, box, etc.) and must then superimpose the desired cancelling impedance onto the system. The characteristics of the electromechanical components have been thoroughly studied and described. As a result, the adaptation is possible only with complex transmission functions of the signal-shaping transducer. These transmission function can only be realized approximately.

One variant of the basic idea of hybrid sound attenuators are active Helmholtz resonators according to German patent document DE 42 26 855 and Spannheimer, H., Freymann, R., Fastf, H.: Aktiver Helmholtz-Resonator zur Daempfung von Hohlraumeigenschwingungen. Fortschritte der Akustik [Active Helmholtz resonator for attenuating self-induced cavity vibrations. Advances in Acoustics]—DAGA 1994, DPG-GmbH, Bad Honnef: 1994, pages 525 to 528 (compare FIG. 7, applied preferably in motor vehicles). In FIG. 7, a conventional Helmholtz resonator represents the passive sub-system described in German patent document DE 40 27 511, which is subjected to an active modification on its rear side.

In detail, the Helmholtz resonator, which is known per se, is defined by a hollow body 16 and an opening 17. A microphone 18, which is located outside the Helmholtz resonator (beside the opening), provides information about the prevailing acoustic pressure at the opening. Here, a transmission system 20 with specific (PDT) frequency and time response characteristics generates the required voltage for the loudspeaker 19 in the hollow body. This loudspeaker 19 determines or varies the transmission characteristics (resonance frequency) of the original Helmholtz resonator. Hence, the loudspeaker in the hollow body serves to practically enlarge (generally: change) the volume of the hollow body for an improved sound absorption of the Helmholtz resistor at low frequencies. Therefore, in this system, active reduction of the resonance frequency and thus the sound absorption of the passive Helmholtz resonator is sought.

It is an object of the present invention to improve the efficiency of the reactive sound attenuator consisting of a cavity with sound-proof limits and including at least one membrane, an acoustic sensor in the immediate vicinity in or on the membrane, as well as an electroacoustic transducer and an inverting signal amplifier, as well as to reduce the engineering expenditures involved with such an attenuator.

This and other objects and advantages are achieved by the reactive sound attenuator according to the invention, in which both the detection of, and an active modification of, the sound field occur directly and immediately on the duct wall.

In accordance with the objectives of the invention, the fundamental principle of the reactive sound attenuator, i.e., the exploitation or amplification of the membrane vibrations as sound field image directly in the duct wall provides various advantages over existing active sound attenuators.

In another objective of the invention, the reactive sound attenuator is operable without passive sub-systems (porous absorbers, Helmholtz resonators, etc.). This fact, as well as a spatial concentration of a membrane and a sensor in a duct wall, permit the use of a plain amplifier. Hence, all the components of the reactive sound attenuator can be integrated in a compact housing without any problems.

In another advantageous feature of the invention, several adjacent reactive sound attenuators are arranged in a three-dimensional cascade in the duct wall or in sound-reducing cells. This results in a correspondingly higher sound attenuation. The attenuation effect of reactive sounds attenuators in a cascade in the duct is practically limited only by secondary sound paths (in analogy with passive sound attenuators).

According to yet another object of the present invention, the reactive sound attenuator may be adapted to any sound fields and any sound field limits such as duct deflectors. The reactive sound attenuator cassettes and hence all electroacoustic components may be protected from physical and chemical loads occurring in the duct via acoustically pervious covers.

In an embodiment of the reactive sound attenuator, using a microphone as the sensor, the microphone is positioned behind the membrane, i.e., in the cavity of the cassette. The principle of operation of the reactive sound attenuator may not only be applied with plane waves in comparatively narrow ducts, but may be applied to achieve an attenuation of modal sound fields in any duct or space. In these applications, the vibrating membranes of the reactive cassettes equally ensure a reduction of the sound pressure on the area of the clad or lined wall surface, thus attenuating the sound field that exists there.

DETAILED DESCRIPTION OF THE DRAWINGS

Figure 1:
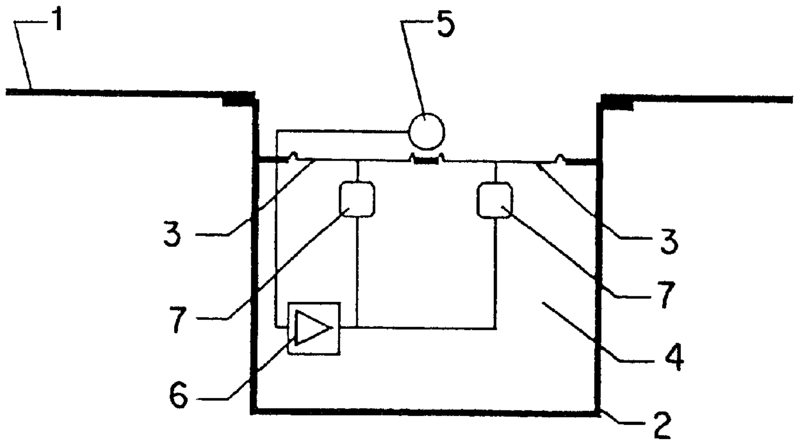
FIG. 1 is an exemplary embodiment of a reactive sound attenuator cassette in a duct wall 1, consisting of the housing 2 with at least one membrane 3 in front of a cavity 4, a sensor 5, a linear amplifier 6 and an electroacoustic transducer 7 according to the invention.

As shown in FIG. 1, a closed compact cassette 2 constitutes the fundamental module in which all the components are combined. Its front side is part of the duct wall 1 and is embodied by at least one membrane 3 which is able to vibrate, e.g., a loudspeaker membrane. On account of its area-related mass, this membrane 3 with the cavity 4 of the rearwardly located cassette housing forms an acoustic resonance system. Sound waves, which occur in the duct, activate this resonance system to thus cause the resonance system to vibrate at and near its self-induced frequency. For activation of the resonance system, a sensor 5 is employed which detects the membrane's vibration. This sensor 5 is disposed in the immediate vicinity of the membrane 3. Alternatively, the sensor can be disposed in the membrane 3 or on it. This sensor function could be implemented, for instance, by microphones, vibration pickups or optical motion sensors. The output signal of the sensor 5 first undergoes an inverting linear amplification 6 and is then used to control an electroacoustic transducer 7, e.g., the speech coil of a loudspeaker. As a result, the membrane is forced to perform stronger vibrations so that the acoustic pressure on the clad wall surface is further reduced and the sound wave experiences a stronger attenuation.

Figure 2:
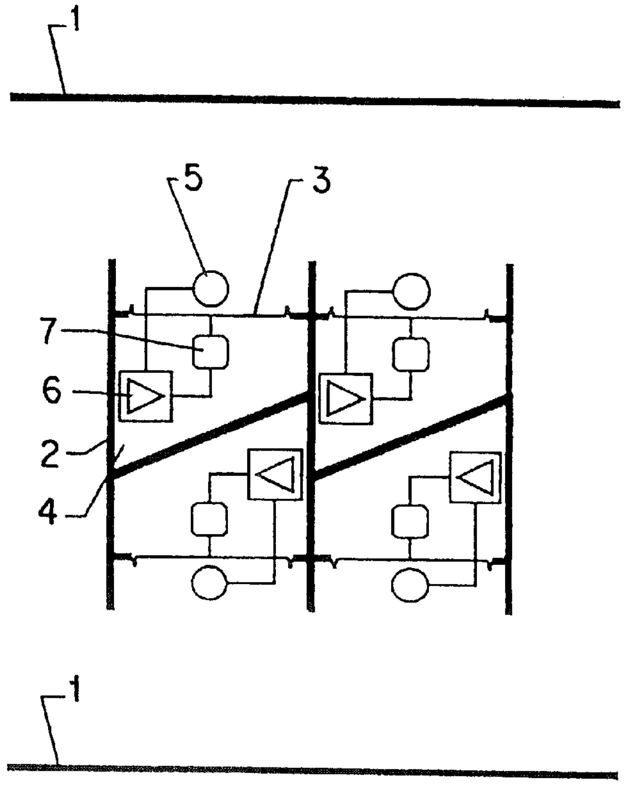
FIG. 2 shows a cascade arrangement of reactive sound attenuator cassettes in a sound-reducing cell according to the invention.

The shape of the housing 2 is variable because it is the mere volume of the cavity 4 that influences the frequency characteristic. Absorbers may be provided inside the housing 2 which are impervious to outward sounds such that any cavity resonance is suppressed. Moreover, the area-related membrane mass may be used for a spectral adaptation of the resonance system, e.g., via different loudspeakers. The linear amplifier 6, which is provided on account of the principle, does not include any means for assessing the frequency of the sensor signal in order to avoid undesirable phase shifts caused by filters, signal shaping generators or other transmission systems. As a result, the occurrence of any interfering acoustic interactions among adjacent cassettes is avoided and it becomes possible to produce large-area reactive sound attenuators which are composed of a great number of individual cassettes, e.g., in reactive sound-attenuating cells as shown in FIG. 2. Provision of the operating voltages for the sensors 5 and amplifiers 6 is implemented with conventional power supplies or batteries.

Figure 3:
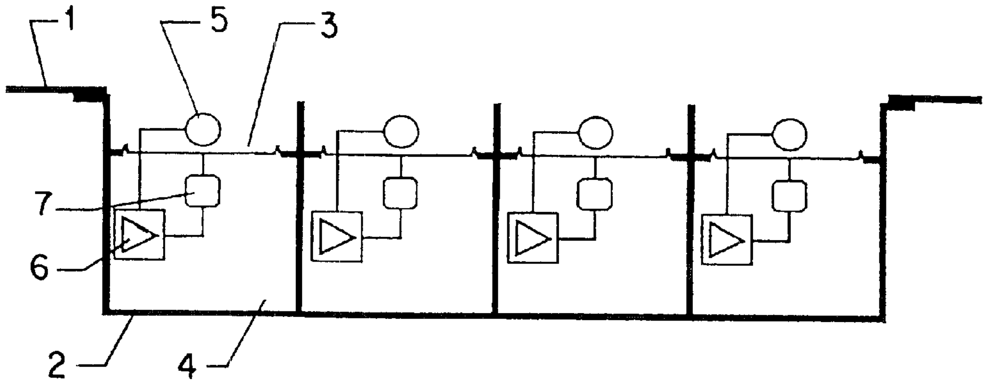
FIG. 3 shows an embodiment of a reactive sound attenuator consisting of four cassettes in a duct wall 1 having a duct cross-sectional area of 0.25 m×0.25 m according to the invention.
Figure 4:
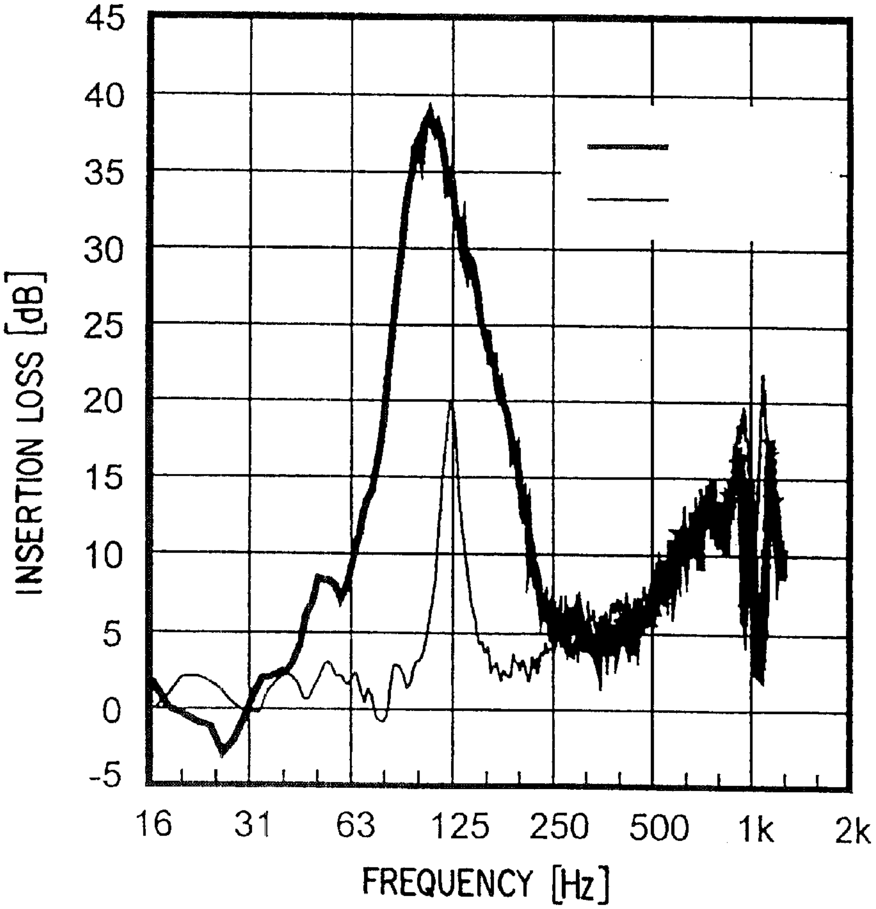
FIG. 4 is a plot of the insertion loss as measured on the exemplary reactive sound attenuator shown in FIG. 3.
Figure 5:
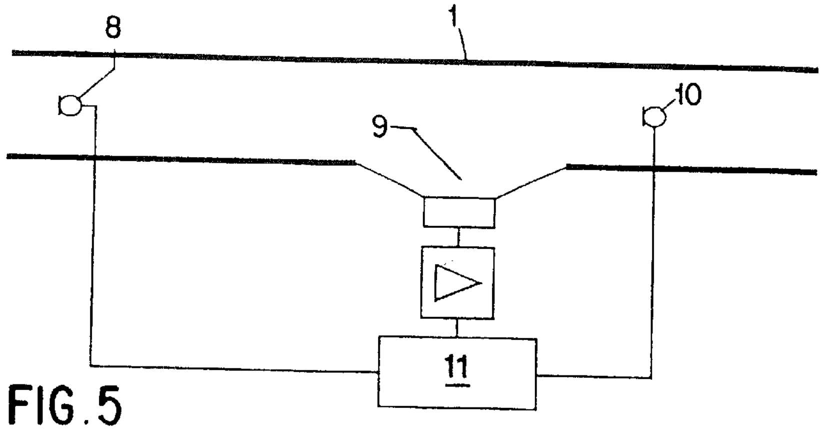
FIG. 5 PRIOR ART
FIGS. 5 through 7 show prior art anti-noise systems.
Figure 6:
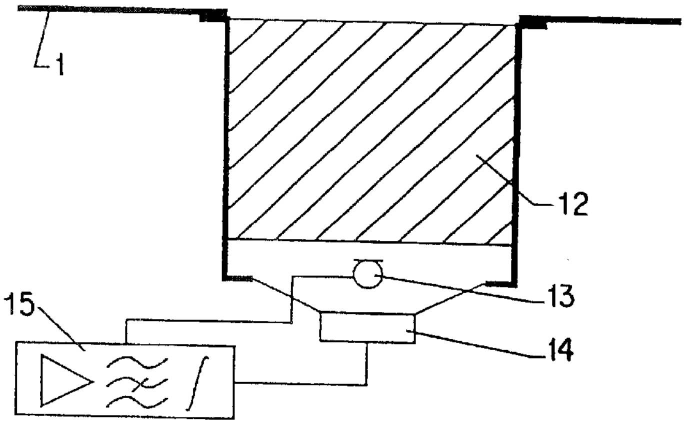
FIG. 6 PRIOR ART
Figure 7:
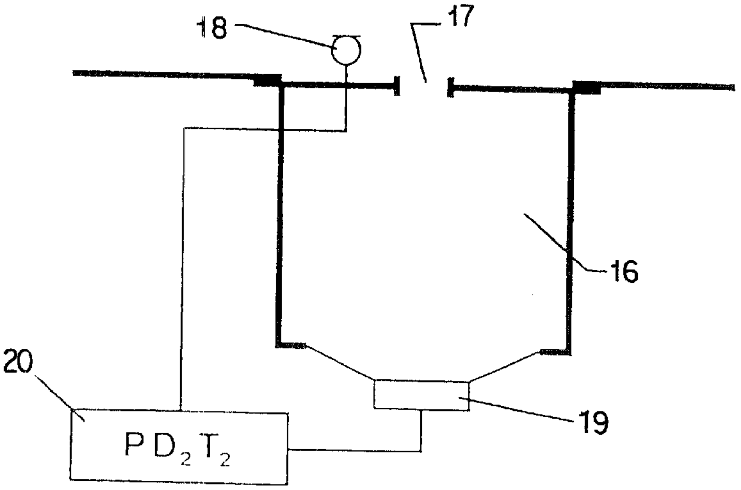
FIG. 7 PRIOR ART

FIG. 4 is a plot of the measured insertion loss of an exemplary reactive sound attenuator consisting of 4 cassettes, as illustrated in FIG. 3.

What is claimed is:

1. A reactive absorbing sound attenuator, comprising:

a cavity;

at least one membrane disposed in the cavity;

a sensor disposed in an immediate vicinity of, in or on the membrane;

at least one electroacoustic transducer coupled to the membrane; and an inverting signal amplifier coupled to the electroacoustic transducer and the sensor;

wherein in use resonance vibrations of the membrane are detected by the sensor and transmitted and amplified by the electroacoustic transducer and the signal amplifier; and wherein for sound absorption within a space, the membrane forms a wall of the space, and wherein an acoustic mass of the membrane and an acoustic resilience of the cavity behind the membrane, which act as a resonance system, are tuned to a frequency of maximum desired sound attenuation in the space, and wherein the inverting signal amplifier is not matched to a transmitting function between the sensor, the membrane and the electroacoustic transducer, but has a linear transfer function without any shift of a frequency range of attenuation of the resonance system.

2. The reactive sound attenuator according to claim 1, wherein the wall of the space is a duct wall.

3. The reactive sound attenuator according to claim 1, wherein the maximum desired vibration attenuation level occurs in said duct wall.

4. The reactive sound attenuator according to claim 1, wherein the inverting signal amplifier is a linear amplifier.

5. The reactive sound attenuator according to claim 1, wherein at least one of a mass of the membrane and a volume of the cavity are matched with a sound field to be attenuated.

6. The reactive sound attenuator according to claim 1, wherein the sensor is an acoustic or optical sensor and detects one of a pressure, a sound particle velocity and a movement of the membrane.

7. The reactive sound attenuator according to claim 1, wherein the at least one electroacoustic transducer is a plain linear loudspeaker.

8. The reactive sound attenuator according to claim 1, wherein the cavity is surrounded by a housing which is impervious to sound.

9. The reactive sound attenuator according to claim 1, wherein an acoustically pervious cover is arranged in front of the membrane.

10. The reactive sound attenuator according to claim 1, wherein an acoustically pervious cover is arranged on the membrane.

11. The reactive sound attenuator according to claim 1, wherein several sound attenuators are disposed in planar juxtaposition in one of a duct wall, a flow duct and sound-reducing cells.

* * * * *